(12) United States Patent
Roxenborg et al.

(10) Patent No.: US 10,962,604 B2
(45) Date of Patent: Mar. 30, 2021

(54) ARRANGEMENT FOR INJECTION-BASED GROUND FAULT PROTECTION HANDLING

(71) Applicant: ABB Schweiz AG, Baden (CH)

(72) Inventors: Stefan Roxenborg, Västerås (SE); Zoran Gajic, Västerås (SE); Tord Bengtsson, Västerås (SE); Mikael Sehlstedt, Nordingrå (SE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 16/528,076

(22) Filed: Jul. 31, 2019

(65) Prior Publication Data

US 2020/0103453 A1    Apr. 2, 2020

(30) Foreign Application Priority Data

Oct. 1, 2018 (EP) ..................................... 18197829

(51) Int. Cl.
    *G01R 31/50* (2020.01)
    *G01R 27/18* (2006.01)
    (Continued)

(52) U.S. Cl.
    CPC ............. *G01R 31/50* (2020.01); *G01R 27/18* (2013.01); *G01R 31/343* (2013.01);
    (Continued)

(58) Field of Classification Search
    CPC .... G01R 31/024; G01R 31/025; G01R 31/50; G01R 31/343; G01R 31/346; G01R 27/18;
    (Continued)

(56) References Cited

U.S. PATENT DOCUMENTS

| 4,446,426 A | * | 5/1984 | Emery | ................. | H02H 1/0015 |
| | | | | | 324/102 |
| 4,771,355 A | * | 9/1988 | Emery | ................. | G01R 31/343 |
| | | | | | 324/546 |

(Continued)

OTHER PUBLICATIONS

Rajeswari, R. "A comparative study of wavelet based computational intelligence techniques for the protection of parallel transmission lines, synchronous generators and power transformers", Faculty of Electrical Engineering, Anna University: Chennai: Jun. 2009: Section 5.2.1, figure 5.2 pp. 49-93.

(Continued)

*Primary Examiner* — Huy Q Phan
*Assistant Examiner* — Dustin R Dickinson
(74) *Attorney, Agent, or Firm* — Slater Matsil, LLP

(57) ABSTRACT

An arrangement for injection-based ground fault protection handling including a number of stator windings of an electric machine that are connected to a neutral point, a first transformer including at least one primary winding connected to at least one measurement point of the stator windings and at least one secondary winding for measuring an electrical quantity of the machine at the measurement point. There is also a second transformer having a primary winding connected between the neutral point and a ground potential and a secondary winding for connection to a signal generation and detection unit in order to inject a signal into the neutral point and receive a response. The impedance of the second transformer is in the range of the impedance of the machine.

19 Claims, 4 Drawing Sheets

(51) Int. Cl.
  *G01R 31/34*  (2020.01)
  *H02H 1/00*  (2006.01)
  *H02H 3/17*  (2006.01)
  *H02H 7/06*  (2006.01)

(52) U.S. Cl.
  CPC .............. *H02H 1/003* (2013.01); *H02H 3/17* (2013.01); *H02H 7/06* (2013.01)

(58) Field of Classification Search
  CPC .......... H01H 1/003; H01H 3/17; H01H 3/165; H01H 7/06
  See application file for complete search history.

(56) References Cited

U.S. PATENT DOCUMENTS

| | | | |
|---|---|---|---|
| 5,739,693 | A | 4/1998 | Pfiffner |
| 8,405,940 | B2 | 3/2013 | Schweitzer, III |
| 2009/0160454 | A1* | 6/2009 | Johansson ................ H02H 3/17 324/509 |
| 2011/0085272 | A1 | 4/2011 | Schweitzer, III et al. |
| 2013/0193979 | A1 | 8/2013 | Gajic |
| 2013/0268216 | A1* | 10/2013 | Dalban Pilon ......... G01R 27/18 702/58 |
| 2013/0335097 | A1 | 12/2013 | Johansson et al. |
| 2013/0335098 | A1* | 12/2013 | Johansson ............ G01R 31/343 324/510 |
| 2014/0107955 | A1* | 4/2014 | Thompson ........... G01R 31/343 702/58 |
| 2015/0168481 | A1* | 6/2015 | Hackl .................... G01R 31/50 324/551 |
| 2019/0097418 | A1* | 3/2019 | Chowdhury ......... G01R 31/346 |
| 2019/0238082 | A1* | 8/2019 | Zhao ....................... A47J 31/00 |

OTHER PUBLICATIONS

Extended European Search Report Application No. EP 18 19 7829 Completed: Mar. 26, 2019;dated Apr. 11, 2019 5 pages.

* cited by examiner

ARRANGEMENT FOR INJECTION-BASED GROUND FAULT PROTECTION HANDLING

TECHNICAL FIELD

The invention relates to fault handling of electric machines. The invention more particularly relates to an arrangement for injection-based ground fault protection handling of such an electric machine.

BACKGROUND

An electric machine, such as a generator, may be subject to ground faults in the stator windings.

The neutral point of power generators is normally connected via an impedance to ground to limit the current in case of a stator ground fault as such a current could melt the iron core of the stator. This impedance is a grounding impedance that may additionally be used for measurements. However, if there are two ground faults, large currents can circulate in the stator anyhow. It is therefore of value to know if a stator has one ground fault as a second one may be catastrophic. These faults can be detected in service in the major part of the winding by measuring the neutral point voltage with a transformer or at some other point of the winding. In the literature, this is often called 95% stator-earth fault protection. This transformer could be a low-power voltage transformer if the impedance is directly connected to the neutral point (IEC grounding) or a higher-powered distribution transformer if the impedance is connected to the low-voltage side of the transformer (ANSI grounding). It is also possible to employ variations of the ANSI grounding, such as to connect a three-phase transformer to other points of the windings, for instance to three stator connection terminals, in an "open-delta" connection scheme for creating a virtual neutral point for the measurements. Here IEC is an acronym for International Electrotechnical Commission and ANSI is an acronym for American National Standards Institute.

This type of protection is fast, has proven to be reliable and is used for a majority of generators.

There is a problem though and that is that ground faults close to the neutral point cannot be detected.

Injection-based ground fault protection is a method to detect generator stator ground faults even if they are close to the neutral point. According to the method, this is achieved by injecting a test signal into the generator neutral point or another injection point and, by measuring the current and possibly also the voltage injected, estimate the resistance to ground. When injection-based ground fault protection is combined with the 95% stator-to-earth protection, it is possible to detect generator stator ground faults in any position of the winding under all operating conditions, even in standstill. However, the injection-based protection is slower and more complex than the 95% protection, which means that both may be needed.

Injection-based ground fault protection for the above-mentioned schemes is disclosed in US2011/0085272. In this document there is an injection transformer connected to the windings of an electric machine according to the three schemes. There is also a current transformer provided together with the injection transformer, which current transformer is placed adjacent a grounding resistance that the injection transformer uses.

Another way of performing injection-based ground fault protection can be found in U.S. Pat. No. 5,739,693 where an injection transformer is connected across a first resistance and a measurement transformer is connected across a second resistance, which resistances are connected in series between ground and the neutral point of three stator windings of an electric machine.

Yet another example can be found in US2009/0160454, where a potential voltage transformer injects a signal between a ground potential and the neutral point of a number of stator windings and the response is detected by a differently placed measurement means that may be a current transformer or a Rogowski coil.

Also, the thesis "A comparative study of wavelet based computational intelligence techniques for the protection of parallel transmission lines, synchronous generators and power transformers" by Rajeswari, Faculty of Electrical Engineering, Anna University: Chennai, June 2009 discusses the injection of signals into the stator windings via the neutral point.

In one particular version of the injection-based ground protection scheme, the injected voltage and current is measured on the low-voltage side of the transformer and a calibration procedure makes it possible to estimate the impedance from the injection measurement point, such as the neutral point to ground. This protection is applicable to all types of generator grounding methods except directly grounded, which are uncommon for reasons stated above.

The above-described various ground protection schemes all generally work well. However, each different connection scheme may have reliability problems with regard to the impedance determination.

It would therefore be of interest to obtain an improvement in that the quality of the impedance determination is obtained independently of which connection scheme that is used. It would for instance be desirable to obtain good results for both IEC and ANSI grounding.

The present invention is directed towards such improvement.

SUMMARY

One object of the invention is therefore to provide an improved quality in a determination of an impedance during injection-based ground fault protection independently of which connection scheme that is used.

This object is achieved through an arrangement for injection-based ground fault protection handling, the arrangement comprising:

a number of stator windings of an electric machine, the stator windings being connected to a neutral point, a first transformer comprising at least one primary winding connected to at least one point of the stator windings and at least one secondary winding for measuring an electrical quantity of the machine at a measurement point of the first transformer, and a second transformer having a primary winding connected between the neutral point and a ground potential and a secondary winding for connection to a signal generation and detection unit in order to inject a signal into the neutral point and receive a response, wherein the impedance of the second transformer is in the range of the impedance of the machine.

The impedance of the machine is the natural machine to ground impedance, which may in turn be mainly capacitive and comprise the capacitance of the stator winding to ground.

The impedance of the second transformer is the winding impedance. It may be the impedance seen from the primary side when the secondary side is short-circuited.

The impedance of the second transformer may with advantage be in a first range of 0.25-4 times the impedance of the electric machine.

The second transformer may be a control power transformer. With a control power transformer is understood a transformer having a power rating of several kVA, such as 5-10 kVA, where the primary side may be designed for voltages in the kV range, such as 15-25 kV, and the secondary side may be designed for voltages in the range of hundreds of volt, such as 100-240 V.

The first transformer may in turn be a distribution transformer or a voltage transformer. A voltage transformer is a transformer solely designed for voltage measurement purposes and may only need sufficient power to drive the secondary side measurement equipment. It may have a power rating of about 50-200 VA, where the design of the primary side is dictated by intended use and the secondary side may be designed for voltages in the range of hundreds of volts, such as 110 V. With a distribution transformer is understood a transformer having a power rating in the range 50-200 kVA. The distribution transformer may have a low-voltage side designed for voltages in the range of hundreds of volt, such as 100-240 V and a high-voltage side designed for voltages in the kV range, such as 3-30 kV.

The arrangement may furthermore comprise the signal generation and detecting unit connected to the secondary winding of the second transformer. The signal generation and detecting unit may more particularly be configured to inject the signal, detect the response and determine the impedance to ground at the neutral point.

The arrangement may also comprise an electrical quantity detecting unit connected to the at least one secondary winding of the first transformer for detecting the voltage and/or current of the measurement point.

The arrangement may also comprise a grounding impedance, such as a grounding resistance, connected to the first transformer. The grounding impedance is here used for measuring the voltage and/or current of the measurement point.

The grounding impedance may be connected to at least one secondary winding of the first transformer. As an alternative the grounding impedance may be connected between the neutral point and the ground potential and the primary winding of the first transformer may be connected in parallel with the grounding impedance. In the latter case the primary winding of the second transformer may also be connected in parallel with the grounding impedance.

The measurement point may be the neutral point, in which case there may be one primary winding of the first transformer connected between the neutral point and the ground potential as well as in parallel with the primary winding of the second transformer.

Alternatively, the first transformer may comprise a number of primary windings, each connected to a corresponding stator winding. In this case the grounding impedance may be connected in a closed path together with a corresponding number of secondary windings of the first transformer. The measurement point would in this case be a virtual neutral point formed through the connections of the first transformer.

The primary winding of the first transformer may be connected to the stator windings according to one of a number of connection schemes.

When there are a number of connection schemes, the schemes may comprise:

a first connection scheme where the measurement point is the neutral point, a grounding impedance is connected between the neutral point and the ground potential, the first transformer comprises one primary winding and one secondary winding, where the primary winding of the first transformer is connected in parallel with the grounding impedance and with the primary winding of the second transformer, a second connection scheme where the measurement point is the neutral point, the first transformer comprises one primary winding and one secondary winding, which primary winding is connected in parallel with the primary winding of the second transformer between the neutral point and the ground potential and the secondary winding of the first transformer is connected to a grounding impedance, a third connection scheme where the first transformer comprises a number of primary windings, each connected to a corresponding stator winding, and a corresponding number of secondary windings connected in a closed path together with a grounding impedance and the measurement point is a virtual neutral point formed through the connections of the first transformer, and a fourth connection scheme where the measurement point is the neutral point, the first transformer comprises one primary winding connected in parallel only with the primary winding of the second transformer between the neutral point and the ground potential and a secondary winding connected to an electrical quantity detecting unit in such a way that the primary winding inserts an impedance between the neutral point and the ground potential that is proportional to an impedance of the electrical quantity detecting unit, thereby causing the neutral point to float.

The impedance being inserted by the first transformer in the fourth connection scheme may be at least 100 times higher than the impedance of the stator and with advantage at least 1000 times higher. The inserted impedance may as an example be about 100 MΩ and the stator impedance about 1 kΩ.

The actually used connection scheme may thus be a scheme in the above-mentioned group. It is then also possible that the group of schemes consists of the first, second, third and fourth connection schemes.

The connection schemes may also be considered to be ground connection schemes as they all involve connecting a first transformer between the stator windings and a ground potential.

The signal generation and detecting unit may be configured to inject the signal, detect the response and determine the impedance at the neutral point in the same way irrespective of the connection scheme used. Thereby the performance of the signal generation and detecting unit will also be the same irrespective of the connection scheme used.

The invention has a number of advantages. It provides reliable ground fault protection irrespective of which connection scheme that is used. Increased reliability is thus achieved independently of the connection scheme that is used. The increased reliability may thereby also be achieved while still using a particular connection scheme, which is of advantage if the connection scheme is a requirement.

It should be emphasized that the term "comprises/comprising" when used in this specification is taken to specify the presence of stated features, steps or components, but does not preclude the presence or addition of one or more other features, steps, components or groups thereof.

BRIEF DESCRIPTION OF THE DRAWINGS

The invention will now be described in more detail in relation to the enclosed drawings, in which.

DETAILED DESCRIPTION

Figure 1:
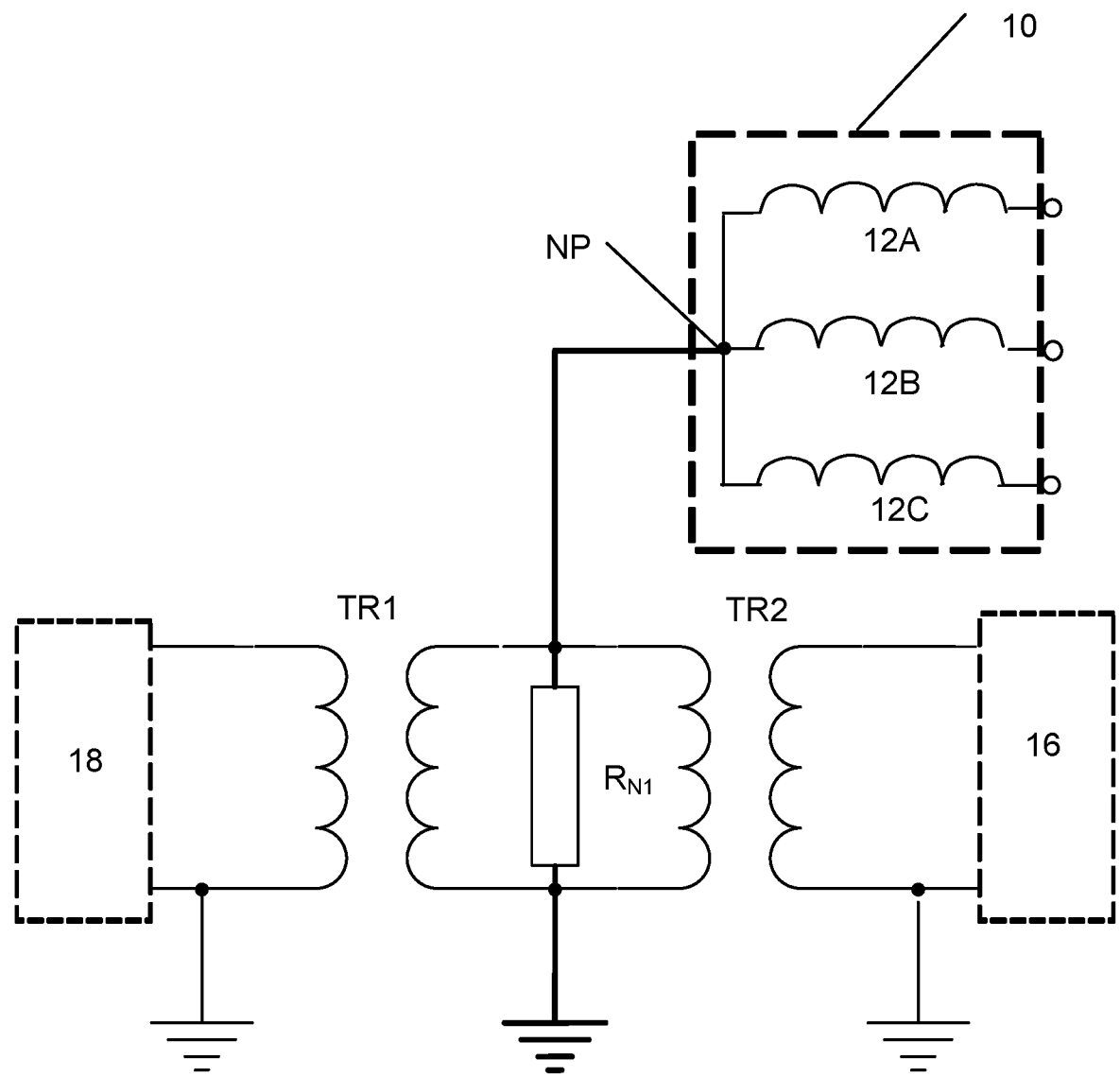
FIG. 1 schematically shows a first embodiment of an arrangement for injection-based ground fault protection handling.

Electric machines, such as generators or motors, may be provided for a number of electric phases, in which case the machine has a number of stator windings and a corresponding number of rotor windings.

The stator windings may be connected to a neutral point.

As was mentioned above, the neutral point has normally an impedance to ground to limit the current in case of a stator ground fault as such a current could melt an iron core of the stator. If there are two ground faults, however, large currents can circulate in the stator anyhow. It is therefore of value to know if a stator has one ground fault as a second one may be catastrophic. These faults can be detected in service in the major part of the winding by measuring the neutral point voltage with a transformer.

The fault may additionally be detected through injecting a signal with a special frequency into the winding via a transformer and use the response to measure the fault impedance to ground of the stator winding. In today's stator injection protection, a stationary test signal is typically injected through either a Voltage Transformer (VT) or a Distribution Transformer (DT) from the low voltage side of respective transformer. With a voltage transformer is understood a transformer solely designed for voltage measurement purposes and may only need sufficient power to drive the secondary side measurement equipment. It may have a power rating of about 50-200 VA, where the design of the primary side is dictated by the intended use and the secondary side may be designed for voltages in the range of hundreds of volt, such as 110 V. It is understood that a distribution transformer is a transformer having a power rating in the range 50-200 kVA. The distribution transformer may have a low-voltage side designed for voltages in the range of hundreds of volts, such as 100-240 V, and a high-voltage side designed for voltages in the kV range, such as 3-30 kV.

The transformer could thus be a low-power voltage transformer if the impedance is directly connected to the neutral point (IEC grounding) or a higher-powered distribution transformer if the impedance is connected to the low-voltage side of the transformer (ANSI grounding), where IEC grounding is a first type of connection scheme used for the first transformer and ANSI grounding is a second type of connection scheme used for the transformer.

Also, other types of connection schemes exist. In a third type of connection scheme, which is also a variation of the ANSI grounding scheme, the distribution transformer is a three-phase transformer connected to the stator windings in an "open-delta" connection, where a virtual neutral point is created for making measurements.

A fourth type of connection scheme is a variation of the first type, however without use of grounding impedance and with the neutral point floating.

When these types of connection schemes are used, problems may arise with regard to the reliability of the detection of a stator to ground fault.

In the first type of scheme, the main problem source seems to be the voltage transformer. These have normally a high winding impedance which is in series with the generator impedance and the winding impedance is often more than 10 times larger. Thereby, only a very small part of the injected signal can penetrate the VT and sense the stator winding. This means that only a fraction of the measured signals contains information on the generator impedance. In some cases, problematic and barely acceptable, only 2% of the signal is useful. In addition to obvious problems with noise and measurement accuracy, this fact also makes the measurement sensitive to changes in the magnetization current for the VT. Additionally, it has been found that VT properties vary a lot and it is hard to evaluate if a proposed installation will have problems or not beforehand. The situation can be improved by injecting more current, but a limit is enforced by the VT construction (max thermal rating of VT secondary winding is typically less than 4 A). Consequently, the estimates of fault resistance to ground are not good and reliable for all applicable electric machines with VT grounding, for instance synchronous machines.

In the second and third type of scheme, the main problem occurs for high-voltage generators where the neutral point or virtual neutral point impedance can be extremely small, below 0.1Ω or even below 60 mΩ. This results in a very low voltage on the injection transformer and thus a low signal to noise ratio. Consequently, a huge amount of current, in order of tens of Amperes, is required in order to penetrate the DT with the injected signal and sense the stator winding. Even though the winding impedance of distribution transformers is substantially lower than for VTs, this impedance further degrades the measurement accuracy.

In the fourth type of scheme, only voltages can be measured via the neutral point.

Therefore, the estimates of fault resistance to ground are not good and reliable for all applicable electric machines, such as synchronous machines, with any grounding.

Moreover, ANSI and IEC grounding schemes are in many cases de facto industry standard ways to ground the stator windings.

There is in view of what has been described above a need for an improvement in the reliability of the measurements. Moreover, it would be desirable if this improvement can be achieved for all the above-mentioned connection schemes, i.e. while still meeting the specific connection requirement of the stator.

Aspects of the invention are directed towards these issues.

This is generally addressed through providing an arrangement for injection-based ground fault protection handling that comprises a number of stator windings of the electric machine, where the stator windings are connected to a neutral point. The arrangement also comprises a first transformer comprising at least one primary winding connected to at least one point of the stator windings and at least one secondary winding for measuring an electrical quantity of the machine at a measurement point of the first transformer. The arrangement also comprises a second transformer having a primary winding connected between the neutral point and a ground potential and a secondary winding for connection to a signal generation and detection unit in order to inject a signal into the neutral point and receive a response. In the arrangement the impedance of the second transformer is also in the range of the impedance of the machine.

All primary windings of the first transformer may furthermore be connected to said at least one point of the stator windings according to one of a number of connection schemes.

FIG. 1 schematically shows a first embodiment of an arrangement for injection-based ground fault protection handling according to a first connection scheme. The arrangement comprises an electric machine 10 having a number of stator windings 12A, 12B and 12C. In the example given here the number of stator windings is three and the machine 10 is a generator. It should be realized that the number of stator windings may be more or fewer. The machine can also be a motor. The impedance of the machine that is of importance here is the natural machine to ground impedance. This machine impedance is in turn mainly capacitive and comprises the capacitance of the stator winding to ground.

The three stator windings 12A, 12B and 12C are connected in a Y-configuration so that there is a neutral point NP at a junction where the stators are connected to each other. A first end of each stator winding 12A, 12B and 12C is thus connected to the neutral point NP while second ends of the stators 12A, 12B and 12C are connected to further equipment via corresponding connection terminals. Each stator winding may as an example be connected to a respective primary winding of a step-up transformer.

The neutral point NP is connected to a ground potential via a ground connection path.

The arrangement also comprises a first and a second transformer TR1 and TR2. The first transformer TR1 comprises at least one primary winding connected to the stator windings and at least one secondary winding for measuring a property of the machine. In this first embodiment the first transformer is a single-phase transformer. There is therefore only one primary winding and one secondary winding.

The second transformer TR2 is likewise a single-phase transformer. The second transformer TR2 has a primary winding connected between the neutral point NP and the ground potential and a secondary winding for connection to a signal generation and detection unit 16. The signal generation and detection unit 16 may thus be connected to the secondary winding of the second transformer TR2. In some variations of the first embodiment the signal generation and detecting unit 16 is included in the arrangement, while it is excluded from some other variations. However, if the unit 16 is not included, the arrangement should be connected to it when in operation.

Moreover, the second transformer TR2 has an impedance that is in the range or vicinity of the impedance of the electric machine 10. This impedance of the second transformer is the winding impedance, which is the impedance seen from the primary side when the secondary side is short-circuited. The impedance may more particularly be in a first range 0.25-4 times the impedance of the electric machine 10.

The impedance of the second transformer TR2 may as an example be in the range of 0.25-2 k$\Omega$, which may be the case if the impedance of the machine is about 1 k$\Omega$. The second transformer TR2 may because of this be a control power transformer.

A control power transformer is a transformer having a power rating of several kVA, such as 5-10 kVA, where the primary side may be designed for voltages in the kV range, such as 15-25 kV, and the secondary side may be designed for voltages in the range of hundreds of volt, such as 100-240 V.

There may also be an electrical quantity detecting unit 18 connected to the secondary winding of the first transformer TR1 for detecting an electrical quantity of the neutral point NP, such as the voltage and/or current. In some variations of the first embodiment the electrical quantity detecting unit 18 is included in the arrangement, while it is excluded from some other variations. However, if the unit 18 is not included, the arrangement should be connected to it when in operation.

The first transformer TR1 is connected to the machine according to a first connection scheme, which first connection scheme is the IEC grounding scheme. The measurement point of the first transformer is thereby the neutral point NP.

There is therefore a grounding impedance, which in this case is a first grounding resistance $R_{N_1}$ connected to the first transformer TR1, which first grounding resistance is used for measuring the voltage and/or current of the measurement point. This grounding impedance is also used for limiting circulating currents that could result from a single stator ground fault.

According to this first scheme the neutral point NP is thus grounded via the first grounding resistance $R_{N_1}$. The first grounding resistance $R_{N_1}$ is thus connected in the ground connection path between the neutral point NP and the ground potential.

The first transformer TR1, which may be a voltage transformer, is also connected into this ground connection path between the neutral point NP and the ground potential. More particularly, the first transformer TR1 has its primary winding connected in parallel with the grounding impedance $R_{N_1}$. Also, the primary winding of this second transformer TR2 is connected into the ground connection path. It is also connected in parallel with the grounding impedance $R_{N_1}$ as well as with the primary winding of the first transformer TR1. Thereby there is one primary winding of the first transformer connected between the neutral point and the ground potential as well as in parallel with the primary winding of the second transformer. There is also one secondary winding.

The electrical quantity detecting unit 18 detects the current and/or voltage of the neutral point NP via the first transformer TR1 based on the current through and/or the voltage across the grounding impedance $R_{N_1}$. This is used for so-called "95%" stator ground protection that may safely detect 95% of the ground faults that can occur at the machine based on the detected voltage and/or current at the neutral point NP.

As stated earlier a ground fault may give rise to a circulating current running through the grounding path, which fault may in 95% of the cases be reliably detected by the electrical quantity detecting unit 18 detecting such a circulating current via the grounding impedance $R_{N_1}$.

However, the electrical quantity detecting unit 18 may have problems in the detection of ground faults close to the neutral point NP as there is very little voltage there. The signal generation and detecting unit 16 can detect such ground faults close to the neutral point NP as well as the faults that the electrical quantity detecting unit 18 is capable of detecting. The signal generation and detecting unit 16 therefore performs so-called "100%" stator ground fault protection.

The signal generation and detecting unit 16 that is connected to the secondary winding of the second transformer TR2 injects a test signal into the neutral point NP via the second transformer TR2. The frequencies used by the test signal should be distinctly different from the operational frequency used by the machine and its harmonics. The response of this test signal is then detected by the same signal generation and detecting unit 16 via the second transformer TR2 and is used for determining the impedance at the neutral point NP, which may be the impedance to ground. By measuring the current and the voltage injected, the resistance to ground may thereby be estimated and a ground fault detected.

As the second transformer TR2 has an impedance that is in the region of the impedance of the electric machine, it is also ensured that the signal levels being detected have a sufficient quality for enabling reliable detection.

It is thereby possible to reliably detect also second ground faults.

Figure 2:
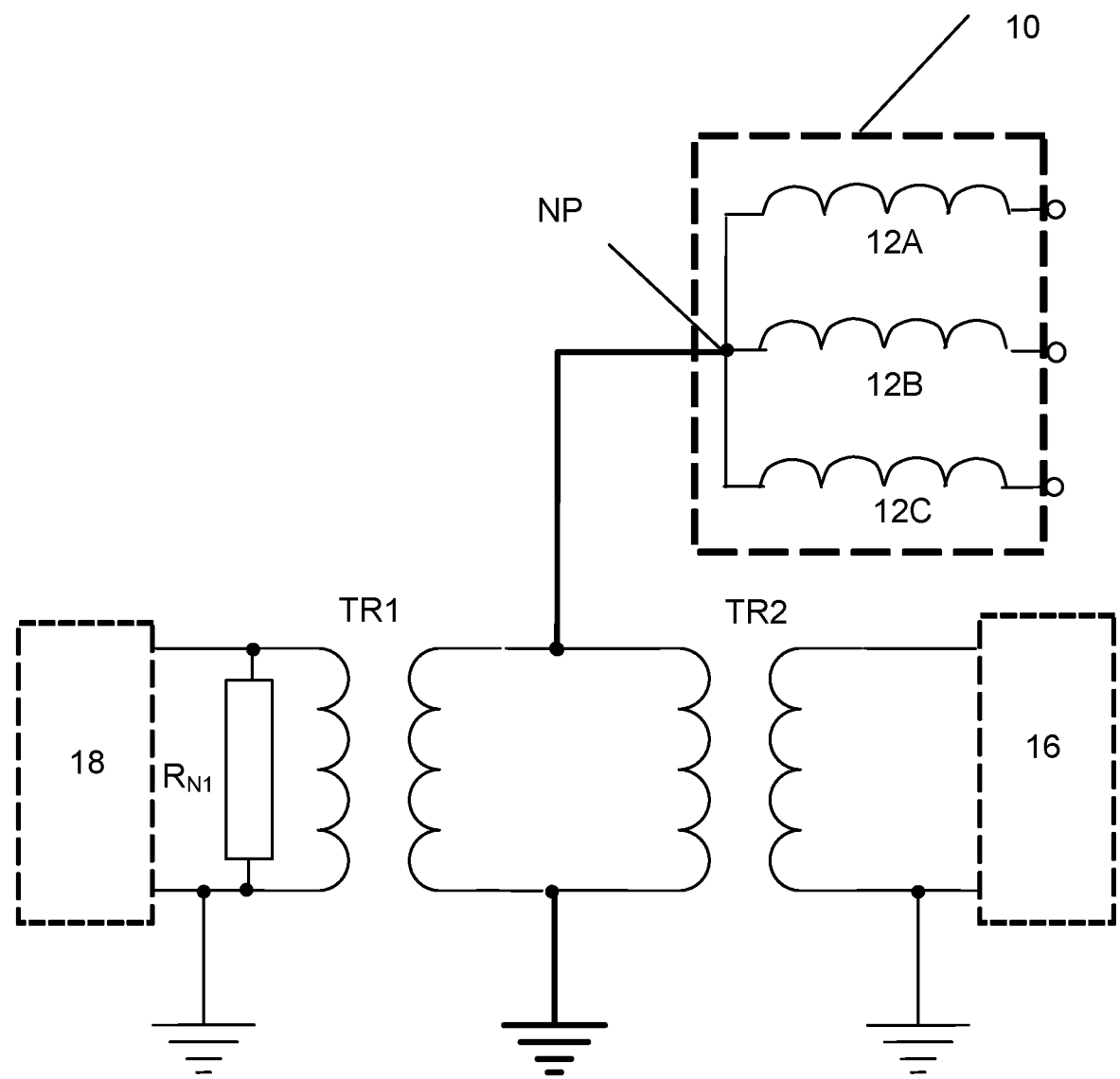
FIG. 2 shows a second embodiment of an arrangement for injection-based ground fault protection handling, FIG. 3 schematically shows a third embodiment of an arrangement for injection-based ground fault protection handling.

FIG. 2 shows a second embodiment of the arrangement.

Just as in the first embodiment, there are here stator windings 12A, 12B and 12C connected to a neutral point NP, which is connected to a ground potential via a ground connection path. There is also a first transformer TR1 comprising one primary winding and one secondary winding connected to an electrical quantity detecting unit 18 and a second transformer TR2 connected to a signal generation and detection unit 16.

Also, in this embodiment the signal generation and detecting unit 16 and the electrical quantity detecting unit 18 may or may not be included in the arrangement. However, if the units 16 and 18 are not included, the arrangement should be connected to them when in operation.

The second transformer TR2 may also in this case be a control power transformer, the impedance of which is in the range or vicinity of the impedance of the electric machine 10, such as in the range 0.25-4 times the impedance of the electric machine 10.

In this second embodiment the first transformer TR1 may be a distribution transformer that is connected to the stator windings according to a second connection scheme, which is the ANSI grounding scheme. Thereby the measurement point of the first transformer is the neutral point NP.

There is therefore a grounding impedance, here realized as a grounding resistance $R_{N_1}$, via which the first transformer TR1 measures the voltage and/or current at the neutral point NP.

For the same reason, the neutral point NP is also here connected to the ground potential. In this type of scheme the primary winding of the first transformer TR1 is connected in the ground connection path. The grounding impedance is however connected to the secondary winding of the first transformer TR1. Although, no grounding impedance is physically connected in this ground connection path, the first transformer TR1 inserts an impedance into the ground connection path, which impedance is proportional to the impedance $R_{N_1}$. The inserted impedance will be $N^2*R_{N_1}$, where N is the turns ratio between the primary and the secondary winding. The first transformer TR1 and the impedance $R_{N_1}$ may therefore together be considered to form a grounding impedance of the ground connection path. This inserted impedance will then also form the previously described circulating current limiting impedance.

Moreover, as can be seen in this second embodiment, the primary winding of the second transformer TR2 is also connected into this ground connection path. It can also be seen that the primary winding of the first transformer is connected in parallel with the primary winding of the second transformer between the neutral point NP and the ground potential. They are thus connected in parallel with each other in the ground connection path. Thereby there is one primary winding of the first transformer connected between the neutral point and the ground potential as well as in parallel with the primary winding of the second transformer.

Also, in this second embodiment the signal generation and detecting unit 16 that is connected to the secondary winding of the second transformer TR injects a signal into the machine via the second transformer TR2, the response of which is detected by the signal generation and detecting unit 16 via the same second transformer TR2 and is used for detecting the impedance at the neutral point for 100% ground fault detection. Likewise the electrical quantity detecting unit 18 may detect the current and/or voltage of the neutral point via the first transformer TR1 for 95% ground fault detection.

As the second transformer has an impedance that is in the region of the impedance of the electric machine due to the fact that it injects the signal directly into the ground connection path having the inserted impedance to ground, it is also in this case ensured that the signal levels being detected have a sufficient quality for enabling reliable detection.

Figure 3:
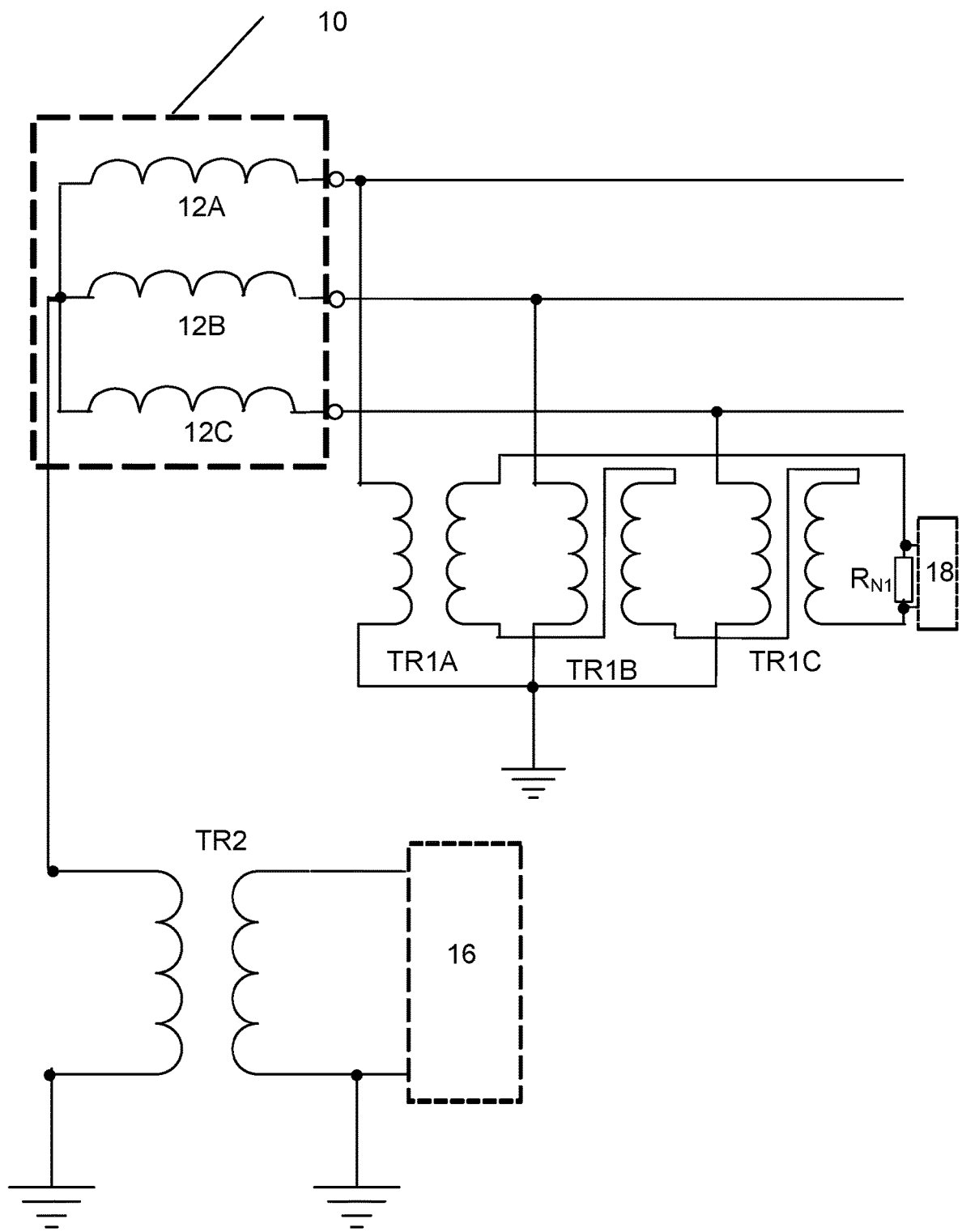

FIG. 3 shows a third embodiment of the arrangement.

Just as in the first and second embodiments, there are here stator windings 12A, 12B and 12C connected to a neutral point NP, which is floating. There is also a first transformer TR1 connected to an electric quantity detecting unit 18 and a second transformer TR2 connected to a signal generation and detection unit 16.

Also, in this embodiment the signal generation and detecting unit 16 and the electrical quantity detecting unit 18 may or may not be included in the arrangement. However, if the units 16 and 18 are not included, the arrangement should be connected to them when in operation.

The second transformer TR2 may also in this case be a control power transformer.

Just as in the second embodiment, the primary winding of the second transformer TR2 is connected between the neutral point NP and a ground potential without any grounding impedance.

The impedance of the second transformer TR2 is likewise in the range or vicinity of the impedance of the electric machine 10, such as in the range 0.25-4 times the impedance of the electric machine 10.

As was stated above, the neutral point of the stator windings is thus ungrounded or floating. The reason for this is the following:

The second transformer TR2 may be seen as introducing an impedance that is proportional to the internal impedances of the unit 16, which is typically very high (ideally infinite). Thereby the impedance introduced between the neutral point NP and the ground potential will be very high and thereby the neutral point can be considered to be floating.

In this third embodiment the first transformer may also be a distribution transformer having a grounding impedance in the form of a grounding resistor $R_{N_1}$ connected to the secondary side.

However, the connection scheme used is a third connection scheme which is an "open-delta" connection scheme. The first transformer is therefore a three-phase transformer comprising a number of primary and secondary windings. In order to better show the connection, the three-phase transformer is in FIG. 3 shown as three interconnected single-phase transformers TR1A, TR1B and TR1C. The primary windings of the first transformer are Y-connected as well as connected to corresponding stator windings for instance to the connection terminals of these stator windings. One end of a primary winding is thus connected to a ground potential, while the other end is connected to the second end of a corresponding stator winding. The secondary windings are in turn essentially delta connected. They are connected in a closed path or string. Moreover, a first grounding impedance, realized as a resistance $R_{N_1}$, is connected into the closed path with the secondary windings. The grounding impedance can be seen as being connected in series with the secondary windings of the first transformer in the string. It can also be seen as being connected between two secondary windings. The electrical quantity measuring unit 18 is in turn connected in parallel with the first grounding impedance $R_{N_1}$. It can thereby also be seen that this grounding impedance $R_{N_1}$ is connected in the closed path together with the secondary windings of the first transformer TR1A, TR1B, TR1C.

Through this "open-delta" connection of the grounding impedance between the two of the secondary windings, such as the secondary windings of the legs TR1A and TR1C, there is created a virtual neutral point that is not related to ground. This virtual neutral point, which is the measurement point of the first transformer, is used in the same way as the actual neutral point of the second embodiment.

Also in this third embodiment, the ground fault detection performed by the electrical quantity detecting unit 18 may not be able to detect a second ground fault and therefore the signal generation and detecting unit 16 is used to inject a signal into the machine via the second transformer TR2, the response of which is detected by the signal generation and detecting unit 16 via the second transformer and is used for detecting the impedance at the neutral point.

Thereby also this embodiment provides a reliable ground fault detection.

Figure 4:
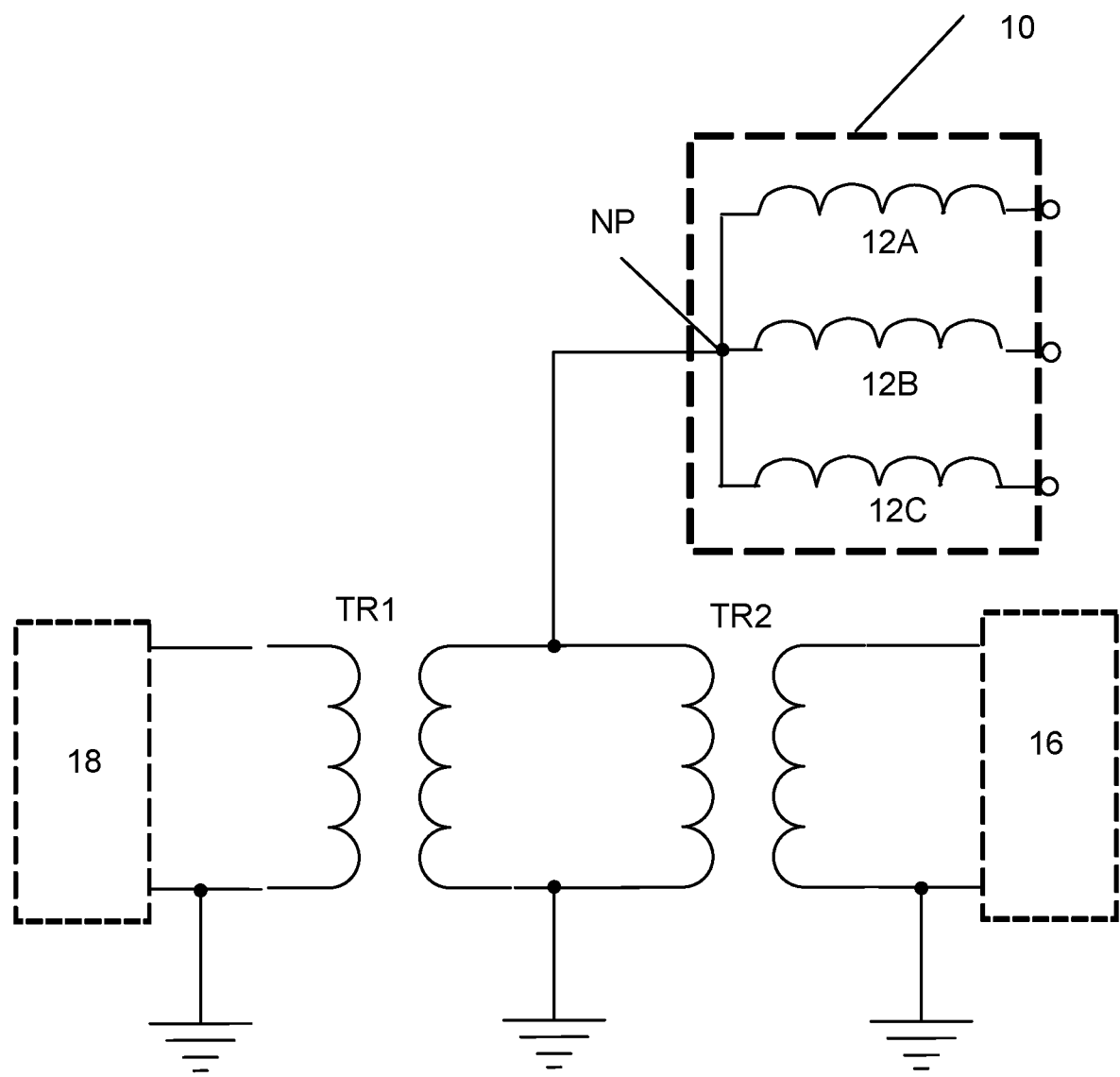
FIG. 4 shows a fourth embodiment of an arrangement for injection-based ground fault protection handling.

FIG. 4 shows a fourth embodiment of the arrangement.

Just as in the first, second and third embodiments, there are here stator windings 12A, 12B and 12C connected to a neutral point NP, a first transformer TR1 connected to an electrical quantity detecting unit 18 and a second transformer TR2 connected to a signal generation and detection unit 16.

Also, in this embodiment the signal generation and detecting unit 16 and the electrical quantity detecting unit 18 may or may not be included in the arrangement. However, if the units 16 and 18 are not included, the arrangement should be connected to them when in operation.

The second transformer TR2 may also in this case be a control power transformer and the first transformer TR1 a voltage transformer.

The impedance of the second transformer is likewise in the range or vicinity of the impedance of the electric machine 10, such as in the range 0.25-4 times the impedance of the electric machine 10.

However in this embodiment a fourth connection scheme is used, which is an ungrounded or floating neutral point connection scheme. The neutral point of the stator windings is thus ungrounded or floating.

The first transformer TR1 is again a single-phase transformer. However, the primary windings of both the first and the second transformer are connected between the neutral point and a ground potential, for instance in parallel with each other. Thereby the measurement point of the first transformer is again the neutral point NP. There is also one primary winding of the first transformer connected between the neutral point and the ground potential as well as in parallel with the primary winding of the second transformer. The primary winding of the first transformer TR1 is more particularly only connected in parallel with the primary winding of the second transformer TR2.

In this case no current limiting impedances are used and no current will flow for a first stator ground fault. The electric quantity detecting unit 18 will therefore have to rely on voltage measurements for detecting a fault.

As no grounding impedances are used in the embodiment, the first and second transformer TR1 and TR2 may be seen as introducing impedances that are proportional to the internal impedances of the units 16 and 18. As was mentioned earlier, these are typically very high (ideally infinite) and thereby the impedance introduced between the neutral point NP and ground will be very high. This will cause the neutral point to be floating. The secondary winding of the first transformer TR1 is thereby connected to the electrical quantity detecting unit 18 in such a way that the primary winding inserts an impedance between the neutral point NP and ground that is proportional to the impedance of the electrical quantity detecting unit 18.

The impedance being inserted by the first transformer may be at least 100 times higher than the impedance of the stator and with advantage at least 1000 times higher, thereby causing the neutral point to float. The inserted impedance may as an example be about 100 MΩ and the stator impedance about 1 kΩ. Thereby the first transformer TR1 may only be able to detect voltage, but not current.

Also in this fourth embodiment the signal generation and detecting unit 16 that is connected to the secondary winding of the second transformer TR2 injects a signal into the neutral point NP of the machine via the second transformer TR2, the response of which is detected by the signal generation and detecting unit 16 via the same second transformer TR2. The signal and response is used for detecting the impedance at the neutral point NP, which is advantageous if the electrical quantity detecting unit is unable to reliably detect a fault.

It can be seen that through the connection of the second transformer TR2 in the same way in the different embodiments, the signal generation and detection unit is capable of injecting and detecting signals for all the above described connection schemes with good reliability. It is thus possible to obtain the same type of reliable 100% ground fault protection irrespective of which of the connection schemes that is required in a certain situation. There is thus a unified way to inject a test signal irrespective of the connection scheme used. The performance of the protection achieved through using the second transformer and the signal generation and detecting unit will thereby also be similar irrespective of the connection scheme used.

It can thereby be seen that the detection of a stator ground fault improves significantly and problems with Voltage Transformer high series impedance and Distribution Transformer low grounding impedance at injection point are effectively removed. The second transformer has namely a relatively low series impedance and a large part of the signal will propagate through it and consequently the estimated fault resistance to ground of the stator winding is more stable and with bigger accuracy than if injected via the first transformer. Because the injection path is always the same it is typically sufficient to inject up to 4 A on its secondary side in order to achieve good performance for all types of stator winding grounding.

Another advantage is that the second transformer can be used "as is" irrespective of the actual stator grounding equipment used in a particular power station. It can be seen that generators which have no intentional grounding equipment or are grounded via Peterson coils can be protected in the exactly the same way.

Thus, a radical change in the technique for ground fault protection by injection is suggested in that all installations are done in the same way: injection is always through the second transformer connected to the generator neutral point, irrespective of the connection scheme used. This will simplify the engineering and give more predictable performance in addition to other benefits:

For IEC grounding, the uncertainties related to VT properties are eliminated and the performance will improve considerably.

For ANSI grounding, the problem of small impedances is eliminated as the neutral point impedance is now seen as transformed by the distribution transformer, i.e. of the same magnitude as the generator capacitance. Further, the distribution transformer winding impedance will be in series with the neutral impedance.

In addition, the risk that the injection equipment affects other protection functions connected to the neutral point transformer is effectively eliminated. Finally, the choice of neutral point transformer low-voltage level, made by the manufacturer, is no longer a concern. It is therefore no longer necessary to adjust the injection equipment to such a level.

The functionality provided in the electrical quantity detecting unit and the signal generating and detecting unit may each be based on the use of a processor with associated program memory including computer program code for performing its functionality. They may also each be based on the of a digital signal processor (DSP), Application Specific Integrated Circuit (ASIC) or Field-Programmable Gate Array (FPGA).

While the invention has been described in connection with what is presently considered to be most practical and preferred embodiments, it is to be understood that the invention is not to be limited to the disclosed embodiments, but on the contrary, is intended to cover various modifications and equivalent arrangements. Therefore, the invention is only to be limited by the following claims.

The invention claimed is:

1. An arrangement for injection-based ground fault protection handling, the arrangement comprising:
a number of stator windings of an electric machine, the stator windings being connected to a neutral point,
a first transformer including at least one primary winding connected to at least one point of the stator windings and at least one secondary winding for measuring an electrical quantity of the electric machine at a measurement point of the first transformer,
a second transformer having a primary winding connected between the neutral point and a ground potential, and a secondary winding for connection to a signal generator/detector in order to inject a signal into the neutral point and receive a response, wherein an impedance of the second transformer is within a range of an impedance of the electric machine,
the neutral point is a common neutral point,
the stator windings are directly connected to the common neutral point, and
the primary winding of the second transformer is directly connected to the common neutral point.

2. The arrangement according to claim 1, wherein the impedance of the second transformer is between 0.25-4 times the impedance of the electric machine.

3. The arrangement according to claim 2, further comprising the signal generator/detector connected to the secondary winding of the second transformer and configured to inject the signal, detect the response and determine the impedance to ground at the neutral point.

4. The arrangement according to claim 2, further comprising a voltage/current detector connected to the at least one secondary winding of the first transformer for detecting a voltage and/or a current of the measurement point.

5. The arrangement according to claim 2, wherein the second transformer is a control power transformer.

6. The arrangement according to claim 2, further comprising a grounding impedance connected to the first transformer, wherein the grounding impedance is used for measuring a voltage and/or a current of the measurement point.

7. The arrangement according to claim 1, further comprising the signal generator/detector connected to the secondary winding of the second transformer and configured to inject the signal, detect the response and determine the impedance to ground at the neutral point.

8. The arrangement according claim 1, further comprising a voltage/current detector connected to the at least one secondary winding of the first transformer for detecting a voltage and/or a current of the measurement point.

9. The arrangement according to claim 1, wherein the second transformer is a control power transformer.

10. The arrangement according to claim 1, further comprising a grounding impedance connected to the first transformer, wherein the grounding impedance is used for measuring a voltage and/or a current of the measurement point.

11. The arrangement according to claim 10, wherein the grounding impedance is a grounding resistance.

12. The arrangement according to claim 10, wherein the grounding impedance is connected to at least one secondary winding of the first transformer.

13. The arrangement according to claim 12, wherein the first transformer includes a number of primary windings, each connected to a corresponding stator winding, the grounding impedance is connected in a closed path together with a corresponding number of secondary windings of the first transformer and the measurement point is a virtual neutral point formed through the connections of the first transformer.

14. The arrangement according to claim 10, wherein the measurement point is the neutral point, the grounding impedance is connected between the neutral point and the ground potential and the primary winding of the first transformer is connected in parallel with the grounding impedance.

15. The arrangement according to claim 14, wherein the primary winding of the second transformer is connected in parallel with the grounding impedance.

16. The arrangement according to claim 1, wherein the measurement point is the neutral point, there is one primary winding of the first transformer connected between the neutral point and the ground potential as well as in parallel with the primary winding of the second transformer.

17. The arrangement according to claim 1, wherein the first transformer is a distribution transformer.

18. The arrangement according to claim 1 wherein the primary winding of the first transformer is connected to the stator windings according to one of a number of connection schemes including:
a first connection scheme wherein the measurement point is the neutral point, a first grounding impedance is connected between the neutral point and the ground potential, the first transformer includes one primary winding and one secondary winding, where the one primary winding of the first transformer is connected in parallel with the first grounding impedance and with the primary winding of the second transformer,
a second connection scheme wherein the measurement point is the neutral point, the first transformer includes one primary winding and one secondary winding, wherein the primary winding of the first transformer is connected in parallel with the primary winding of the second transformer between the neutral point and the ground potential, and the secondary winding of the first transformer is connected to a second grounding impedance, a third connection scheme wherein the first transformer comprises a number of primary windings, each connected to a corresponding stator winding and a corresponding number of secondary windings connected in a closed path together with a third grounding impedance and the measurement point is a virtual neutral point formed through the connections of the first transformer, or a fourth connection scheme wherein the measurement point is the neutral point, the first transformer includes one primary winding connected in parallel only with the primary winding of the second transformer between the neutral point and the ground potential, and includes one secondary winding connected to a voltage/current detector such that the one primary winding inserts a fourth impedance between the neutral point and the ground potential that is proportional to an impedance of the voltage/current detector, thereby causing the neutral point to float.

19. The arrangement according to claim 18, wherein the signal generator/detector is configured to inject the signal, detect the response and determine the impedance to ground at the neutral point in a same way for each of the first, second, third and fourth connection schemes.

* * * * *